United States Patent
Hu

(10) Patent No.: US 6,417,104 B1
(45) Date of Patent: *Jul. 9, 2002

(54) METHOD FOR MAKING A LOW RESISTIVITY ELECTRODE HAVING A NEAR NOBLE METAL

(75) Inventor: Yongjun Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/450,301

(22) Filed: Nov. 29, 1999

Related U.S. Application Data

(63) Continuation of application No. 08/845,616, filed on Apr. 25, 1997, now Pat. No. 6,004,869.

(51) Int. Cl.[7] .............. H01L 31/11; H01L 27/082; H01L 23/20; H01L 23/552
(52) U.S. Cl. .............. 438/682; 438/585; 438/592; 438/597; 438/649; 438/660; 438/663; 438/669
(58) Field of Search .............. 438/256, 399, 438/585–586, 592, 597, 598, 649, 651, 660–664, 669, 682

(56) References Cited

U.S. PATENT DOCUMENTS

| | | | |
|---|---|---|---|
| 4,373,251 A | 2/1983 | Wilting | 29/571 |
| 4,529,619 A | 7/1985 | Nemanich et al. | 427/86 |
| 5,047,367 A | 9/1991 | Wei et al. | 437/200 |
| 5,136,362 A | 8/1992 | Grief et al. | 357/67 |
| 5,346,860 A | * 9/1994 | Wei | 437/200 |
| 5,451,545 A | 9/1995 | Ramaswami et al. | 437/200 |
| 5,483,741 A | 1/1996 | Akram et al. | 29/846 |
| 5,597,745 A | 1/1997 | Byun et al. | 437/41 |
| 5,605,865 A | 2/1997 | Maniar et al. | 437/200 |
| 5,633,200 A | 5/1997 | Hu | 438/653 |
| 5,635,426 A | * 6/1997 | Hayashi et al. | 438/453 |
| 5,668,040 A | 9/1997 | Byun | 438/396 |
| 5,668,065 A | * 9/1997 | Lin | 438/303 |
| 5,717,253 A | 2/1998 | Shin et al. | 257/754 |
| 5,763,923 A | 6/1998 | Hu et al. | 257/382 |
| 5,830,801 A | 11/1998 | Shiralagi et al. | 438/586 |
| 5,861,340 A | * 1/1999 | Bai et al. | 438/0 |
| 6,004,869 A | * 12/1999 | Hu | 438/585 |

* cited by examiner

*Primary Examiner*—Ha Tran Nguyen
(74) *Attorney, Agent, or Firm*—Schwegman, Lundberg, Woessner & Kluth, P.A.

(57) ABSTRACT

A method for forming conductive lines such as interconnects and DRAM gate stacks. A blanket stack is formed on a substrate including a conductive diffusion barrier, a near noble metal such as cobalt, followed by a silicon layer and a top insulator layer. The blanket stack is patterned with resist to define the conductive lines. The stack is dry etched down to the near noble metal layer. The resist is then removed and the stack is annealed to react the near noble metal and silicon to form a conductive compound having fine grain size. The unreacted noble metal is then wet etched, using the conductive diffusion barrier as a wet etch stop. A further dry etch is then performed down to the substrate, using the top insulator layer as a mask. In this manner, only one mask is required to form the conductive line.

37 Claims, 4 Drawing Sheets

METHOD FOR MAKING A LOW RESISTIVITY ELECTRODE HAVING A NEAR NOBLE METAL

This application is a Continuation of U.S. Ser. No. 08/845,616. filed Apr. 25, 1997 now U.S. Pat. No. 6,004,869.

FIELD OF THE INVENTION

The present invention relates generally to fabricating low resistivity conductive lines and electrodes, and more specifically to fabricating low resistivity conductive lines and electrodes using near noble metals and their compounds.

BACKGROUND OF THE INVENTION

Metal Oxide Semiconductor (MOS) devices are widely used today in ultra large scale integrated (ULSI) devices. MOS devices include memory devices which are comprised of an array of memory cells. Each memory cell is comprised of a capacitor, on which the charge stored represents the logical state of the memory cell. Long conductors, referred to as word lines, serve as gates of multiple access transistors, each of which provides access to a memory cell.

In a dynamic random access memory (DRAM) a common word line is fabricated on a p-type silicon substrate coated with a thin film of silicon dioxide ($SiO_2$), known as gate oxide. Word lines currently are formed on the gate oxide layer as a two-layer stack, comprising silicon (or polysilicon), coated with a conductor material such as tungsten silicide or titanium silicide.

Of primary concern is minimizing resistivity throughout the word line due to the need to reduce RC time constants and access multiple memory cells in as short a period of time as possible. The problem is especially critical due to the extended length of word lines as DRAMs increase in density.

As DRAM density increases, feature sizes, including line sizes, decrease. For example, when the feature size of a conductor, such as tungsten or titanium silicides, is reduced in higher density memories, the Kelvin contact resistance of the conductor increases. Titanium silicide is a large grain material. Thin titanium silicide has nonuniform large grain size that contributes to a very rough titanium silicide/silicon interface. As such, it reduces the effective ohmic contact area. It is therefore desirable to utilize conductors that have smaller grains and hence whose resistivity will not significantly increase for the same feature dimensions.

Conductors utilizing near noble metal suicides, such as $CoSi_2$ have low bulk resistivity and a fine grain with very small line-width dependent Rs effects. They are well suited for sub-quarter micron conductor formation such as polycide word lines or bit lines. However, they are very difficult to pattern because of the nonvolatile nature of cobalt fluorides and chlorides during a dry etch process. Conventional methods of patterning $CoSi_2$ polycide gate electrodes for DRAM devices require extra masks to pattern insulating layers or spacers. A Co salicidation is then used on fill-in Si (poly), The extra masks can significantly increase costs of DRAM devices.

There is a need to decrease the overall resistivity of a word line stack and local interconnects at sub-quarter micron dimensions. There is a need to precisely pattern $CoSi_2$ conductors and word line stacks without introducing additional masks.

There is a further need to precisely etch such conductors and word line stacks in an inexpensive manner.

SUMMARY OF THE INVENTION

A method for forming conductive lines for a semiconductor device, comprises forming a blanket stack on a substrate including a conductive diffusion barrier, a near noble metal such as cobalt, followed by a silicon layer and a top insulator layer. The blanket stack is patterned with resist to define the conductive lines. The stack is etched down to the near noble metal layer. The resist is then removed and the stack is annealed to react the near noble metal and semiconductor to form a conductive compound having fine grain size. The unreacted noble metal is then etched, using the conductive diffusion barrier as an etch stop.

In one embodiment, a further etch is then performed down to the substrate, using the top insulator layer as a mask. In this manner, only one mask is required to form the conductive line.

In one embodiment, the semiconductor device comprises a DRAM (Dynamic Random Access Memory) device, and the conductor is a $CoSi_2$ gate stack. The heating step comprises an anneal at temperatures in excess of approximately 550 degrees Celsius, or at least great enough to react the cobalt and silicon. The gate stack also serves as a word line for the DRAM device. The word line width is sub-quarter micron.

In a further embodiment, the cobalt is etched using a wet etch process which has a high selectivity with respect to $CoSi_2$. The conductive diffusion barrier comprises tungsten nitride or titanium nitride and acts as a stop for the wet etch with at least of portion of it also being etched. The further etch to the substrate is performed using a common dry etch. Further standard process flow is followed to complete the semiconductor device.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawings in which the reference number first appears.

DETAILED DESCRIPTION OF THE EMBODIMENTS

In the following detailed description of the embodiments, reference is made to the accompanying drawings which form a part hereof, and in which is shown by way of illustration specific embodiments in which the inventions may be practiced.

Substrate is used to refer to supporting semiconductor structures during processing. It is understood as including silicon-on-sapphire (SOS) technology, silicon-on-insulator (SOI) technology, doped and undoped semiconductors, epitaxial layers of a silicon supported by a base semiconductor, as well as other semiconductor structures well known to one skilled in the art. Furthermore, when reference is made to substrate in the following description, previous process steps may have been utilized to form regions/junctions in the base semiconductor structure. Scaling in the Figures does not represent precise dimensions of the structures illustrated.

The present invention is directed toward facilitating low-cost fabrication of low resistivity conductors and electrodes in MOS devices and integrated circuits. This goal is achieved by using near noble metals and a combination of wet and dry etch steps without adding additional masks to the fabrication process.

Figure 1A:
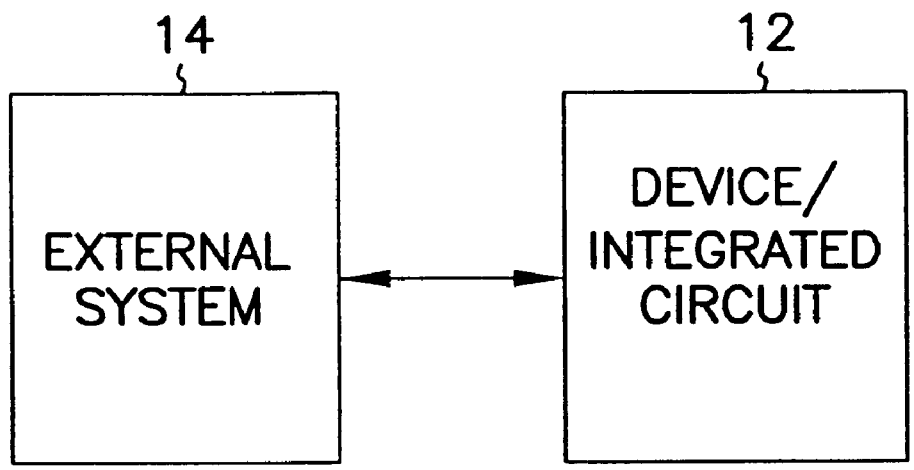
FIG. 1(a) is a block diagram of one embodiment of an integrated circuit coupled to an external system.

The device or integrated circuit 12 may be coupled to an external system 14, as illustrated in FIG. 1(a). The integrated circuit 12 and the external system 14 may be, respectively, a memory such as a DRAM (Dynamic Random Access Memory) and a microprocessor used in a personal computer or other type of device. The device 12 may be a MOS field effect transistor. Alternatively, the external system 14 may be a microcomputer, a cellular telephone, or another form of electronic equipment.

Figure 1B:
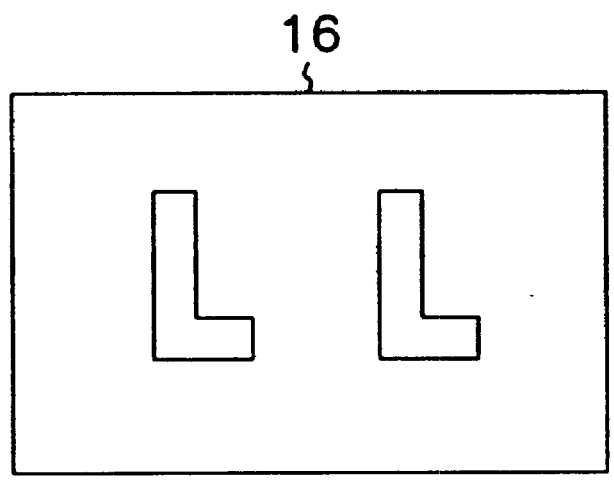
FIG. 1(b) is an aerial view of one embodiment of a mask.

The present invention is useful in fabricating portions of an integrated circuit, such as $CoSi_2$ polycide gate electrodes (word lines) for a DRAM memory and local interconnect conductors. The following process steps are typically accomplished with only one mask. An extremely simple exemplary mask 16 is represented in FIG. 1(b).

Figure 2:
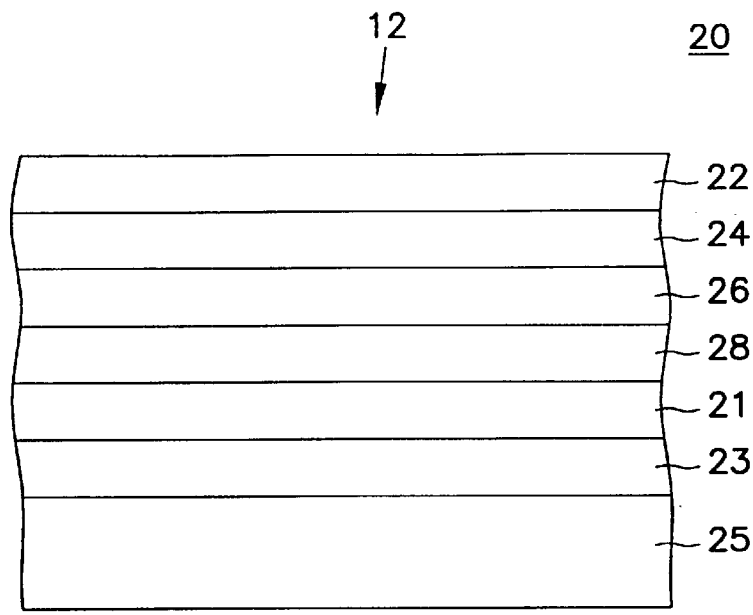
FIG. 2 is a cross-sectional view of one embodiment of an integrated circuit.

Integrated circuit 12 fabrication is commenced with the formation of blanket layers of materials as shown in FIG. 2 at step 20 on top of a base layer 25 such as a substrate. An insulator 23 such as a gate oxide is formed on top of base layer 25, followed by a silicon layer 21 which is polysilicon or amorphous silicon which mar be either doped or undoped. A conductive diffusion barrier 28 is formed on top of the silicon layer 21, followed by a conductor 26, a further silicon layer 24 and a further insulator 22. These materials may be consecutively deposited or otherwise formed using well known techniques on the substrate to form a blanket gate stack for a DRAM using common CVD or PVD processes, one upon another such that layers next to each other are referred to as being adjacent to each other. Insulator 22 is oxide, nitride or other type of electrical insulator and is formed last. Silicon layer 24 comprises a doped layer of polysilicon or amorphous silicon. Conductor 26 is a near noble metal, such as cobalt, nickel, iron or alloys thereof. The conductive diffusion barrier 28 is a nitride, such as either a tungsten nitride layer approximately 50 to 500 Angstroms thick, or titanium nitride, or metal silicon nitride, tungsten silicon nitride or titanium silicon nitride. The conductive diffusion barrier 28 should have a good etch selectivity with the conductor 26 during a dry etch or a wet etch process. For example the conductive diffusion barrier 28 should etch more slowly than the conductor 26. The base layer 25 may be any type of semiconductor, such as silicon.

Figure 3:
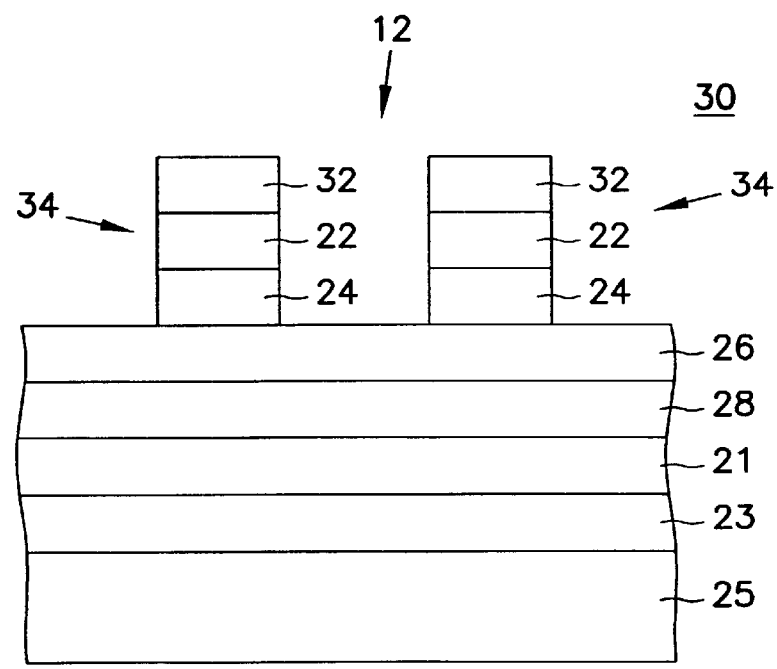
FIG. 3 is a cross-sectional view of one embodiment of an integrated circuit after patterning a masking layer and removing material.

Next, the materials are patterned (step 30 in FIG. 3) such as by radiation based lithography using a mask 16 to substantially define an electrode 34. The patterning is accomplished with a masking layer 32, such as a photo resist which is suitable for use with the radiation used. Materials not covered by the masking layer 32 are removed, for example, by etching, such as dry etching down to the conductor 26. The dry etching may be accomplished with plasma etching, reactive ion etching or a combination thereof. For example, material, including insulator 22 and silicon layer 24, are removed. In general, a dry etch process utilizes chlorine or fluorine based gases, such as $NF_3$, $CF_4$, and $CCl_4$, etc., to remove materials in uncovered areas. Because near noble metal fluorides and chlorides, e.g., cobalt fluorides and chlorides, are highly nonvolatile, the dry etch process stops at the near noble metal conductor 26. Therefore, the conductor 26 also acts as a dry etch stop.

After the material is removed, then the remaining masking layer 32 is also removed from the integrated circuit 12. Patterning, as used herein is defined as both the exposing of resist and the combination of exposing and removing material to define desired structures. It can also mean any other type of method whereby patterns may be defined and created on a substrate.

Figure 4:
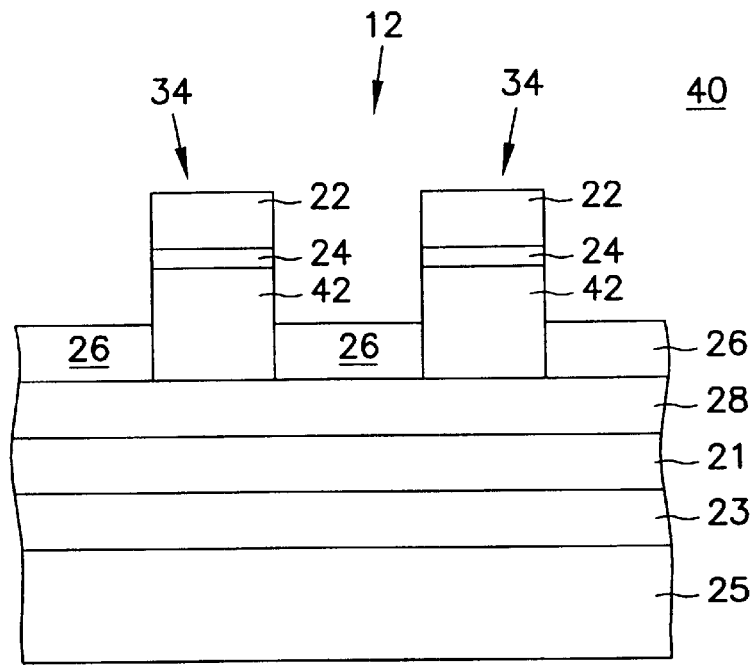
FIG. 4 is a cross-sectional view of one embodiment of an integrated circuit after heating.

Next, the integrated circuit 12 is subjected to RTP (step 40), as illustrated in FIG. 4. The integrated circuit 12 can be heated in a rapid thermal annealer or a furnace between 550° and 850° C. for about 20 seconds. In one embodiment, the preferred temperature range for heating is between about 600° and 750° C.

During heating (step 40), the silicon layer, 24 and conductor 26 combine to form a compound 42, such as a silicide. In one embodiment, the conductor 26 is cobalt. The cobalt consumes the silicon to form $CoSi_2$ (cobalt disilicide) during the heating (step 40). Since cobalt atoms are the dominant diffusion species during this siliciding step, straight sidewall profiles of the poly or amorphous silicon are preserved. The thickness of the silicon should be approximately 3.7 times the thickness of the cobalt. Typically, a sufficient thickness of silicon layer 24 should be initially formed (step 20), so that a portion of silicon layer 24 is not converted to the compound 42. The unconverted silicon layer 24 facilitates connection between the electrode and a metal interconnect.

Figure 5:
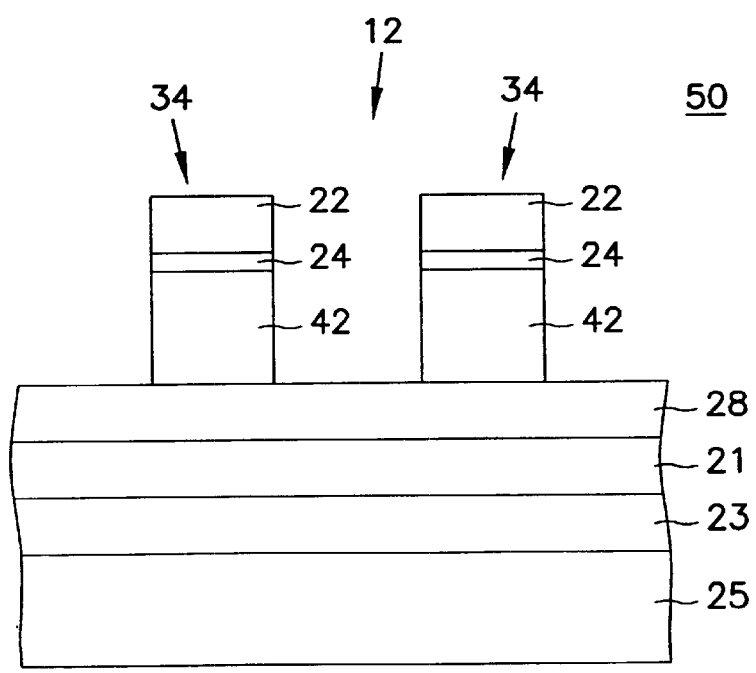
FIG. 5 is a cross-sectional view of one embodiment of an integrated circuit after removing more material.

After heating (step 40), unreacted conductor 26 is removed (step 50), such as by timed wet etching, as illustrated in FIG. 5. The wet etch is performed using etchants with good selectivity with respect to the noble metal. For cobalt, APM (SC1) or SC2 which are well known to persons skilled in the art are suitable. Additionally, some or all of the conductive diffusion barrier 28 may be removed. However, typically, the wet etches remove the conductive diffusion barrier 28 at one half the rate that the conductor 26 is removed. It thus serves as a wet etch stop. Up to approximately 5% of the feature width of the conductive diffusion barrier 28 may be undercut during the etch to reduce gate electrode edge leakage. In one embodiment, dilute $NH_4OH:H_2O_2:H_2O$ in a concentration of approximately 1:1:5, or further diluted with water to 1:1:20 or more is used to etch the unreacted cobalt. This is followed by use of a diluted APM to etch the conductive diffusion barrier 28 as desired. Actual concentrations are easily determined by one skilled in the art and are dependent on materials used.

Figure 6:
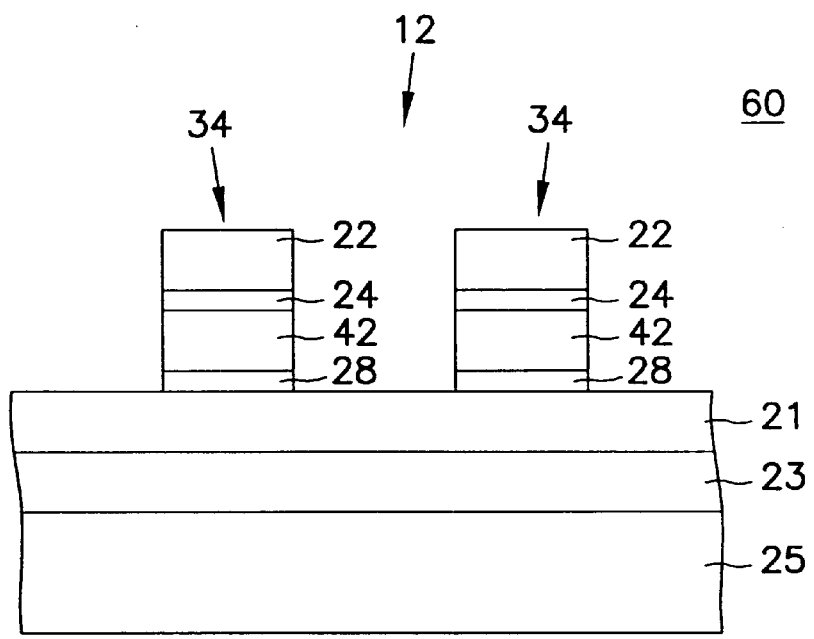
FIG. 6 is a cross-sectional view of a second embodiment of an integrated circuit after removing more material.
Figure 7:
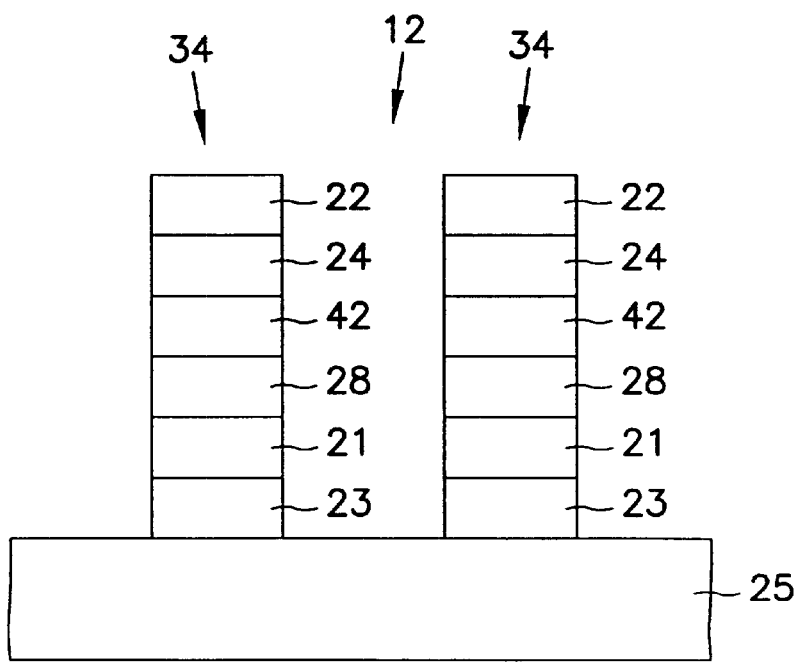
FIG. 7 is a cross-sectional view of one embodiment of an integrated circuit after additional material is removed.

Any remaining conductive diffusion barrier 28, exposed area of silicon layer 21 and insulator 23 are then removed (step 60), such as by dry etching, as illustrated in FIG. 6 and FIG. 7. The dry etch proceeds to the substrate 25 with the already patterned insulator 22 acting as a mask. Thus, the electrode 34 is further defined. Completion of the fabrication of the integrated circuit 12, including spacer formation and source/drain reoxidation is accomplished with standard processing steps well known by persons skilled in the art.

Conductors such as local interconnects are formed in a similar manner on top of oxides, BPSG, and Si source and drain areas. The wet etch stop comprising a conductive diffusion barrier is formed directly on top of the oxide, BPSG layer and Si source and drain areas. This is followed by the near noble metal, silicon, and further oxide which is patterned to define the desired conductors. As above, the substrate is then etched to the noble metal, annealed, and then wet etched to the conductive diffusion barrier, using it as a wet etch stop. A further etch is performed to finish defining the conductor, followed by further normal processing steps.

While the invention has been described with the use of cobalt and silicon, it will be recognized by one skilled in the art that the process of forming the conductors and electrodes may utilize other near noble metals and other types of semiconductor materials which form conductors having a fine grain size. By providing such a fine grain size, the resistance of such conductors is greatly improved as the width of the conductors decreases below sub-quarter micron dimensions. Further, the conductive diffusion barrier material which serves as a wet etch stop may be comprised of many different materials such as titanium and tungsten nitrides and metal silicon nitrides. These materials may also be used to form conductors having widths greater than sub-quarter micron dimensions.

What is claimed is:

1. A method for forming a conductive line for a semiconductor device, comprising:
    patterning a blanket stack which includes a near noble metal, a conductive diffusion barrier under the near noble metal, and silicon on the near noble metal to define the conductive line;
    removing portions of the stack to substantially define the conductive line;
    annealing the line to form a compound comprising the near noble metal and silicon;
    removing the near noble metal not in compound form.

2. The method of claim 1, wherein removing the near noble metal not in compound form comprises a wet etch.

3. The method of claim 1, wherein the semiconductor device comprises a DRAM and the conductive line comprises a gate stack.

4. The method of claim 1, wherein the near noble metal comprises cobalt.

5. The method of claim 1, wherein the compound comprises $CoSi_2$.

6. The method of claim 1, wherein the annealing step is performed at a temperature of at least approximately 550 degrees Celsius.

7. The method of claim 1, wherein removing the unpatterned silicon comprises etching the patterned blanket stack down to the near noble metal.

8. The method of claim 1, wherein the blanket stack is patterned with a resist.

9. The method of claim 8, further comprising stripping the resist after removing unpatterned silicon.

10. The method of claim 1, wherein the silicon overlies the near noble metal.

11. The method of claim 1, wherein the blanket stack further includes additional silicon.

12. The method of claim 11, wherein the additional silicon underlies the near noble metal.

13. The method of claim 12, wherein the additional silicon underlies the diffusion barrier.

14. A method for forming a conductive line for a semiconductor device, comprising:
    patterning a blanket stack which includes a near noble metal and silicon on the near noble metal to define the conductive line;
    removing portions of the stack to substantially define the conductive line;
    annealing the conductive line to form a compound comprising the near noble metal and silicon;
    removing the near noble metal not in compound form,
    wherein the blanket stack includes a conductive diffusion barrier under the near noble metal, and
    wherein removing the near noble metal not in compound form includes using the diffusion barrier as an etch stop.

15. A method for forming an integrated circuit, comprising:
    forming a blanket stack on a substrate comprising sequential layers of a first oxide, a first silicon, a diffusion barrier, a near noble metal, a second silicon, and a second oxide;
    patterning the blanket stack to define a conductive line;
    etching the patterned blanket stack down to the near noble metal;
    annealing the patterned blanket stack to react the near noble metal with the second silicon layer;
    wet etching to remove unreacted near noble metal; and
    dry etching the patterned blanket stack substantially down to the substrate, wherein the patterning and dry etching steps are performed with the use of only one mask.

16. The method of claim 15, wherein the layers of the blanket stack are consecutive.

17. The method of claim 16, wherein the layers are in the order named.

18. A method for forming an integrated circuit comprising:
    forming a blanket stack on a substrate comprising sequential layers of a gate oxide, a first silicon, a diffusion barrier, a near noble metal, a second silicon and a second oxide;
    patterning the blanket stack with resist to define a conductive line;
    etching the patterned blanket stack down to the near noble metal;
    annealing the patterned blanket stack to react the near noble metal with the second silicon layer, wherein the near noble metal is a dominant diffusion species as it reacts with the silicon to preserve a substantially straight sidewall of the conductive line;
    wet etching to remove unreacted near noble metal;
    dry etching the patterned blanket stack substantially down to the substrate, using a portion of the second oxide layer as a mask.

19. The method of claim 18, wherein the near noble metal is cobalt.

20. The method of claim 18, wherein no more than approximately five percent of the diffusion barrier feature width is undercut during removing of the unreacted near noble metal.

21. A method for forming an integrated circuit, comprising:
    forming a blanket stack on a substrate comprising layers of a gate oxide, a first silicon, a diffusion barrier, a near noble metal, a second silicon and a second oxide;

patterning the blanket stack with resist to define a conductive line;

etching the patterned blanket stack down to the near noble metal;

annealing the patterned blanket stack to react the near noble metal with the second silicon layer;

wet etching to remove unreacted near noble metal;

dry etching the patterned blanket stack substantially down to the substrate.

22. The method of claim 21, the first silicon layer is doped polysilicon.

23. The method of claim 21, wherein the second silicon layer is selected from the group consisting of undoped and doped polysilicon, and undoped and doped amorphous silicon.

24. The method of claim 21, wherein the diffusion barrier is selected from the group consisting of titanium nitride, tungsten nitride, and metal silicon nitride.

25. The method of claim 21, wherein the diffusion barrier is selected from the group consisting of tungsten silicon nitride and titanium silicon nitride.

26. The method of claim 21, wherein the thickness of the diffusion barrier is in the range of 50 to 500 Angstroms.

27. A method for forming an integrated circuit comprising:

forming a blanket stack on a substrate comprising sequential layers of a gate oxide, a first silicon, a diffusion barrier, cobalt, a second silicon and a second oxide;

patterning the blanket stack with resist to define a conductive line;

etching the patterned blanket stack down to the cobalt;

annealing the patterned blanket stack to react the cobalt with the second silicon layer to form a compound, wherein some of the silicon remains after formation of the compound;

wet etching to remove unreacted cobalt;

dry etching the patterned blanket stack substantially down to the substrate, using the second oxide layer as a mask.

28. The method of claim 27, wherein the compound is $CoSi_2$.

29. A method for forming an integrated circuit, comprising:

forming a blanket stack on a substrate comprising sequential layers of a first insulator, a first silicon, a diffusion barrier, a near noble metal, a second silicon, and a second insulator;

patterning the blanket stack to define a conductive line;

etching the patterned blanket stack down to the near noble metal;

annealing the patterned blanket stack to react the near noble metal with the second silicon layer;

wet etching to remove unreacted near noble metal; and dry etching the patterned blanket stack substantially down to the substrate, wherein the patterning and dry etching steps are performed with the use of only one mask.

30. The method of claim 29, wherein the layers of the blanket stack are consecutive in the order named.

31. The method of claim 29, wherein at least one of the insulator layers is a nitride.

32. The method of claim 29, wherein the second insulator layer is a nitride.

33. A method for forming an integrated circuit, comprising:

forming a blanket stack on a substrate comprising sequential layers of a gate insulator, a first silicon, a diffusion barrier, a near noble metal, and second silicon and a second insulator;

patterning the blanket stack with resist to define a conductive line;

etching the patterned blanket stack down to the near noble metal;

annealing the patterned blanket stack to react the near noble metal with the second silicon layer;

wet etching to remove unreacted near noble metal;

dry etching the patterned blanket stack substantially down to the substrate.

34. The method of claim 33, wherein the diffusion barrier is selected from the group consisting of titanium nitride, tungsten nitride, and metal silicon nitride.

35. The method of claim 33, wherein the diffusion barrier is selected from the group consisting of tungsten silicon nitride and titanium silicon nitride.

36. The method of claim 33, wherein at least one of the insulator layers is a nitride.

37. The method of claim 33, wherein the second insulator layer is a nitride.

* * * * *

UNITED STATES PATENT AND TRADEMARK OFFICE
CERTIFICATE OF CORRECTION

PATENT NO.     : 6,417,104 B1
DATED          : July 9, 2002
INVENTOR(S)    : Hu

It is certified that error appears in the above-identified patent and that said Letters Patent is hereby corrected as shown below:

Column 1,
Line 49, delete "suicides" and insert -- silicides --, therefor.
Line 58, delete "(poly)," and insert -- (poly). --, therefor.

Column 2,
Line 30, delete "least of" and insert -- least a --, therefor.

Column 3,
Line 42, delete "mar" and insert -- may --, therefor.
Line 61, after "For example" insert -- , --.

Column 4,
Line 28, delete "layer," and insert -- layer --, therefor.
Line 33, delete "siliciding" and insert -- salicidation --, therefor.

Column 5,
Line 48, delete "claim 1" and insert -- claim 4 --, therefor.

Column 6,
Line 37, after "circuit" insert -- , --.
Line 65, before "layers" insert -- sequential --.

Column 7,
Line 11, after "claim 21," insert -- wherein --.
Line 25, after "circuit" insert -- , --.

Signed and Sealed this

Eleventh Day of March, 2003

JAMES E. ROGAN
*Director of the United States Patent and Trademark Office*